METHOD OF DIFFUSING BORON INTO SILICON WAFERS

Filed Feb. 5, 1962

INVENTOR.
Karl Reinitz
BY
Robert E. Fowler
ATTORNEY

United States Patent Office 3,180,755 Patented Apr. 27, 1965

3,180,755
METHOD OF DIFFUSING BORON INTO SILICON WAFERS

Karl Reinitz, Kokomo, Ind., assignor to General Motors Corporation, Detroit, Mich., a corporation of Delaware
Filed Feb. 5, 1962, Ser. No. 170,935
2 Claims. (Cl. 117—201)

This invention relates to a method of producing desired conductivity characteristics in a semiconductor body, or more specifically to a method of diffusing an impurity into a semiconductor surface to obtain the proper conductivity characteristic.

Semiconductor materials are identified by conductivity characteristics and these may be changed by the addition of donor or acceptor impurities, as the case may be, to obtain the desired end product. For example, in the production of semiconductor diodes one surface of a silicon wafer having N-type conductivity characteristics may be treated with boron to convert a layer thereof to P-type characteristic material. This creates two adjacent regions, one having N and the other P type conductivity characteristics and an intermediate transition region known as the P-N junction. This is a basic diode.

In the past various methods have been used to diffuse the impurity material into the semiconductor surface for such a purpose. For example, in diffusing boron into a silicon surface, one method that has been used is to place the silicon wafer in a gaseous atmosphere of boric oxide ($B_2O_3$) at an elevated temperature. When attempting to diffuse boron into the silicon by this method it has been difficult to obtain a high surface concentration of the oxide in a relatively short time. Also, the surface concentration has been uneven. One way in which to obtain a higher concentration and also to make the concentration more uniform over the surface has been to baffle the flow of the oxide down to a slow rate. Even this has not solved all the problems attendant this method.

It is, therefore, an object in making this invention to provide a method of diffusing a desired substance into a surface of a semiconductor body to modify its conductivity characteristics and obtain high, even surface concentration of the diffusant.

It is a further object in making this invention to provide a method of diffusing boron into a surface of a semiconductor body to obtain a high, evenly distributed surface concentration.

It is a still further object in making this invention to provide a method of diffusing boron tri-chloride ($BCl_3$) into the surface of a silicon wafer to obtain high surface concentration.

With these and other objects in view which will become apparent as the specification proceeds, my invention will be best understood by reference to the following specification and claims and the illustrations in the accompanying drawings, in which:

In previous methods used to diffuse boron into the surface of silicon bodies difficulties in obtaining high surface concentration in a sufficiently short time have been encountered, plus oxidation of the surface to unsatisfactory mechanical glassy states, causing sticking. These difficulties were caused primarily because of the use of boric oxide. It is proposed to use boron tri-chloride as it would overcome many of the difficulties since it would not cause oxidation and in turn would not cause a glassy surface to be created and thus would eliminate sticking. Further boron tri-chloride is easily introduced into the system as a gas at room temperature. Higher temperature, of course, aids in diffusing. It has one difficulty and that is to obtain precise and reproducible deposits. I have, therefore, provided a new and novel process by which boron tri-chloride can be satisfactorily diffused into the surface of silicon wafers to produce P-type conduction areas.

Figure 1:
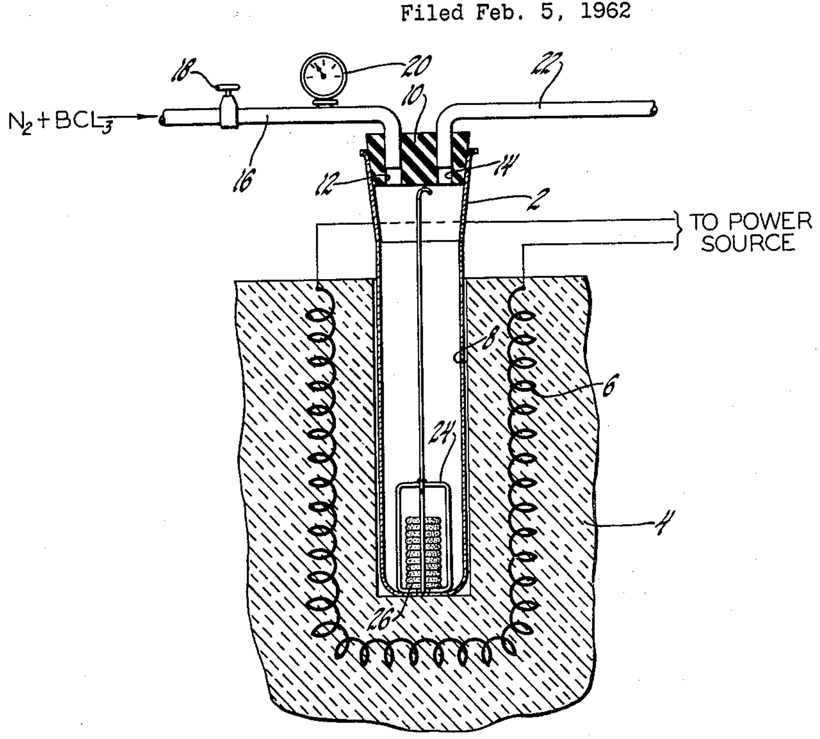
FIGURE 1 is a diagrammatic showing of the equipment used in the first step of my process.

Referring now more particularly to FIG. 1, there is shown therein a vertical crucible 2 generally in the form of a test tube which may be of quartz, within which the silicon wafers can be stacked and the crucible placed in a heated zone, such as an electric furnace 4 having a heating coil 6 therein. The furnace 4 is supplied with a vertical cavity 8 the approximate size of the crucible 2. The upper end of the crucible is open and there may be inserted therein an insulating stopper 10 having a plurality of vents 12 and 14. A glass inlet tube 16 may be inserted in vent 12 through which the desired gaseous combination of nitrogen and boron tri-chloride may be introduced. A control valve 18 is supplied to control the flow of gas and a flow meter 20 is supported on the inlet tube 16 by which the rate of flow can be read. The second vent 14 has an outlet tube 22 inserted therein from which the gas may escape after it is forced from the crucible by the incoming gas.

Figure 2:
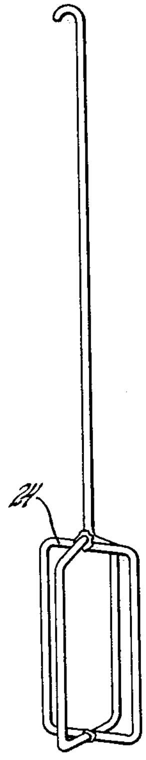
FIG. 2 is an enlarged perspective view of the quartz cage supporting the wafers during the diffusing process; and, FIG. 3 is a schematic view of a further heating stage to age or bake the wafers once the diffusant substance has been applied.

Boron tri-chloride being a heavy gas falls to the bottom of the crucible and tends to remain at this location. Therefore, the wafers to be diffused are supported at that point. A carrier cage 24 shown in detail in FIG. 2 is made up of inert material capable of withstanding high temperatures and may, for example, be quartz. It is so formed that the wafers may be stacked in the cage in face to face relation one upon the other as shown at 26 in FIG. 1. The wafers are stacked, then the cage and its load of wafers are lowered into the crucible tube 2 and the stopper 10 put in place. The temperature is increased to approximately 1200° C. and the gaseous mixture $N_2$ and $BCl_3$ allowed to flow into the crucible. Nitrogen is the carrier gas, the boron tri-chloride being the diffusant. The $BCl_3$ settles to the bottom of the tube for a certain time and it is then expelled at the end of the cycle using the nitrogen alone as an expelling agent. The wafers are maintained in the furnace and in the gaseous atmosphere for approximately one-half hour and through this a controllable and uniform boron deposit is left on the stack of silicon slices. In this process there are three factors that control the diffusing of the boron, the flow rate of the boron tri-chloride gas, length of time of exposure, and temperature. If the flow rate of the $BCl_3$ is insufficient the reaction will be unsatisfactory and if it is excessive the wafers will become sticky and adhere to each other. If the flow rate is within usable limits, however, temperature and time changes may be made which will overcome either a slight deficit or excess in the flow rate of gas. For example, if the flow rate of $BCl_3$ is only slightly insufficient the time of the process may be extended to correct this lack. An increase in temperature would speed up the diffusion also. Quartz powder applied between the wafers will also prevent adhesion of sticky wafers.

Even though the slices of wafers are placed one upon the other in face to face relation the boron penetrates between and sufficiently coats the faces of the wafers to produce desired changes in conductivity characteristic. It is this small spacing between the wafers which provides the control desired and leads to the uniform boron deposition which has not previously been obtained. With this method surface concentration is satisfactory and the uniformity of the surface deposit has been enhanced by the use of the vertical crucible quartz tube 2 since the boron tri-chloride is a heavy gas and settles to the bottom surrounding the wafers.

Figure 3:
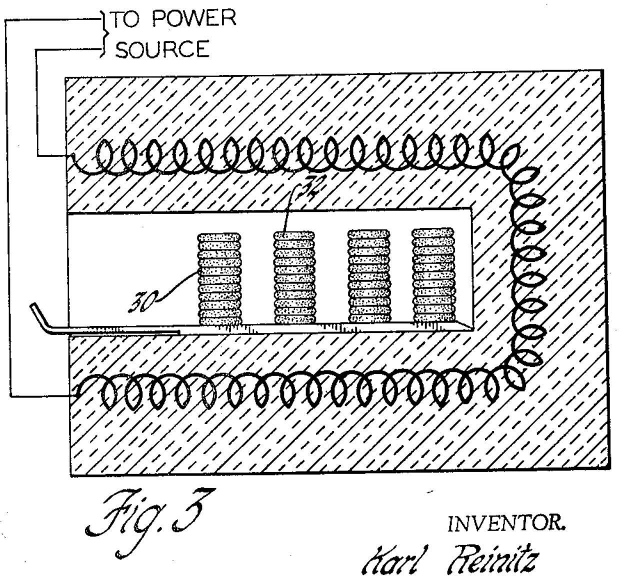

After the wafers have had their initial treatment at 1200° C. in the gaseous atmosphere for perhaps half an hour or so they are removed from the quartz tube 2 and inserted in a horizontal furnace tube in air at approximately 1260° C. for a long period of time as shown in FIG. 3. They are usually maintained in stacked relation for this second heating cycle as shown at 30 and 32 although they can be spread out in a single layer if desired. This causes the boron on the surface to spread smoothly and diffuse evenly into the same to produce the desired result. With the slices or wafers piled one on the other the boron migrates between the wafers and becomes evenly distributed. This enhances the uniformity of surface concentration on any single wafer. The wafers may then, of course, be cooled and taken to other locations and certain areas lapped off for diffusing other impurities therein to produce the final diode structure.

The wafers may be coated with boron and then diffused in one furnace without taking them out by placing stacks of silicon wafers in a furnace, raising the temperature to a desired value such as 1200° C. and flowing the gaseous mixture of $N_2$ and $BCl_3$ into the crucible for the required time. The supply of $BCl_3$ is then shut off and the $N_2$ continued to purge the crucible. The temperature is then raised slightly, say to 1260° C., and maintained until the boron has spread smoothly over and diffused into the wafers. They are then taken out and cooled. This avoids changing from one furnace to another.

What is claimed is:

1. In a method of fabricating semiconductive bodies, the steps of coin stacking a plurality of semiconductive wafers with the major surfaces of the wafers in abutting face-to-face relation, impregnating said wafer surfaces with boron by exposing the stacked wafers to an atmosphere rich in boron trichloride and heating the stacked wafers to diffuse boron uniformly into the wafer surfaces, including the abutting face-to-face major surfaces thereof.

2. In a method of fabricating semiconductive bodies, the steps of coin stacking a plurality of semiconductive wafers with the major surfaces of the wafers in abutting face-to-face relation, impregnating said wafer surfaces with boron by exposing the stacked wafers to an atmosphere rich in boron trichloride, discontinuing contact between said atmosphere rich in boron trichloride and the stack of wafers, and then heating the wafers to uniformly diffuse boron into the wafer surfaces, including the said abutting face-to-face major surfaces thereof.

References Cited by the Examiner

UNITED STATES PATENTS

| | | | |
|---|---|---|---|
| 2,804,405 | 8/57 | Derick | 148—189 |
| 2,868,678 | 1/59 | Shockley | 148—1.5 |
| 3,007,816 | 11/61 | McNamara | 148—189 |
| 3,140,965 | 7/64 | Reuschel | 148—175 |

BENJAMIN HENKIN, *Primary Examiner.*

DAVID L. RECK, *Examiner.*